June 18, 1968 A. JOHNSTON 3,388,465

ELECTRONIC ASSEMBLY SOLDERING PROCESS

Filed March 1, 1965

INVENTOR.
ARTHUR JOHNSTON
BY Robert A. Green
ATTORNEY

United States Patent Office 3,388,465
Patented June 18, 1968

3,388,465
ELECTRONIC ASSEMBLY SOLDERING PROCESS

Arthur Johnston, Bound Brook, N.J., assignor to Burroughs Corporation, Detroit, Mich., a corporation of Michigan
Filed Mar. 1, 1965, Ser. No. 436,043
1 Claim. (Cl. 29—626)

ABSTRACT OF THE DISCLOSURE

The disclosure is of a method of preparing an electronic module which comprises preparing a printed circuit board having conductive runs and holes for receiving component leads, loosely mounting components on the board with their leads extending through holes in the board, applying a sheet of heat-sealable material over the components and securing the sheet to the board to hold the components in place, and then soldering the components to the board. The disclosure is also of apparatus prepared by this method.

Figure 1:
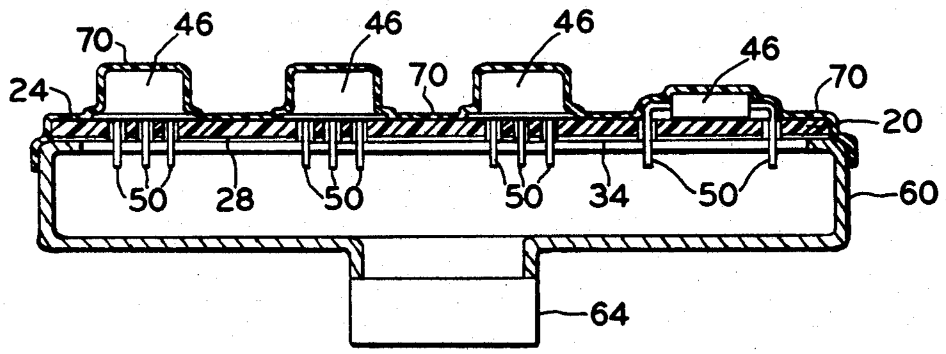

This invention relates to method and apparatus for preparing a printed circuit board and mounting electrical components thereon.

Generally, in preparing a circuit board and mounting electronic components thereon, the board is provided with conductive lines or runs and a plurality of holes at selected locations in contact with selected runs. The components are mounted on the board, with their leads extending through these holes, and the leads are bent over to hold the components in place during handling and soldering, and the board is dip soldered to secure the leads to the runs. Since space is always minimal on a printed circuit board, the component leads must be as short as possible.

This method is generally satisfactory. However, a problem arises when, for example, it is found necessary to remove one or more components from the board. In order to remove a component, heat must be applied to melt the solder on the leads, and at the same time, the bent leads must be straightened. This is a difficult and often damaging operation with small printed circuit boards, small components, and short component leads.

Accordingly, the objects of the invention are concerned with the provision of improved method and apparatus for use in mounting electronic components on a printed circuit board, particularly by means of a soldering process.

Briefly, a printed circuit board to be processed according to the invention is provided with the usual apertures and conductive lines. Components to be secured to the board are prepared with relatively long straight leads, and the components are mounted on the board with the leads inserted in the appropriate apertures. After all of the components have been mounted on the board, a sheet of heat-sealable plastic material is placed over the board and in intimate engagement with the components, and it is heat-sealed in place, holding the unsoldered components securely. The board is then placed in a solder bath, and the required soldering operation is performed. If desired, the heat-sealable plastic sheet is then removed. Since the components initially had straight, longer than normal leads, and these leads project perpendicularly from the printed circuit board, removal of selected components from the board, if necessary, is easily achieved.

Figure 2:
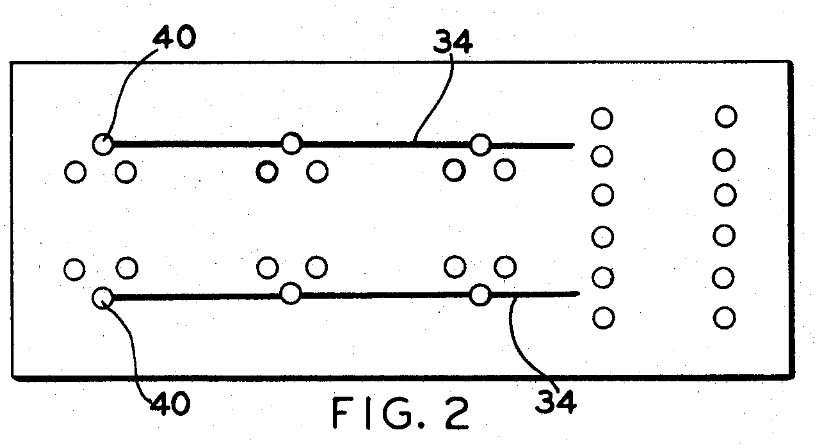

The invention is described in greater detail by reference to the drawing wherein:

FIG. 1 is an elevational view, partly in section, of apparatus embodying the invention; and FIG. 2 is a bottom plan view of the apparatus of FIG. 1.

The principles of the present invention are particularly applicable to the preparation of printed circuit boards carrying electronic components. Referring to FIG. 1, such apparatus includes a relatively thin sheet 20 of insulating material, for example, synthetic resinous material, having top and bottom surfaces 24 and 28, with the bottom surface (FIG. 2) carrying a plurality of conductive lines 34 which are properly oriented to provide the desired interconnections when electronic components are mounted on the board. The board is provided with a plurality of holes 40 which are positioned on the conductive lines 34 at the desired locations, as is well known in the art. The board may also include contact terminals or the like (not shown).

In practicing the invention, the selected electronic components 46, for example, capacitors, resistors, transformers, transistors, or the like, are provided, and their leads 50 are cut to length somewhat greater than that ordinarily employed in mounting components on printed circuits. The components 46 are seated on the top surface 24 of board 20, and their leads 50 are inserted in the appropriate holes in the board 20. Since, according to the invention, the leads 50 are not bent over as in the prior art, they may be somewhat longer, for example, by several millimeters, than in the prior art.

After all of the components have been mounted on the board, the board is placed on a suitable frame or housing 60 which includes suction apparatus 64, and a sheet 70 of heat-sealable plastic material, for example, a vinyl product, is spread over the components 46 on the board. Suction is applied to the frame, and the sheet of plastic material is drawn down over each component so that the components are firmly held in place thereby. Heat is then applied at suitable locations, for example, at the periphery of the board, to cause the plastic sheet to adhere thereto. Thus, a rigid assembly is provided, with the components held securely and substantially rigidly in place for further processing.

The circuit board is now ready for soldering of the components to the conductive lines. This operation may be performed in any suitable manner, as is well known in the art. In one suitable arrangement, soldering is performed by immersing the lower surface of the printed circuit board with the exposed leads 50 in a bath of molten solder. The solder adheres to the leads 50 and the holes 40 and provides the desired electrical contact with the conductive lines. The board is removed from the solder bath after the desired soldering operation has been performed, and, after the usual cooling and cleaning, it is ready for use. The board with its plastic sheath may be shipped as a unit, or the plastic may be removed and the board may be shipped with its components exposed.

Since the component leads 50 are somewhat longer than in the prior art, and since they project perpendicularly from the surface of the printed circuit board rather than being bent over, the leads of selected components may be readily located and freed by the application of heat, and a selected component may be readily removed from the board at any time if this is required.

The present invention thus provides an improved arrangement for handling and preparing printed circuit boards in which electronic components may be held securely in place while they are being soldered.

What is claimed is:

1. The method of preparing an electronic assembly comprising the steps of:

preparing a printed circuit board having a top surface and bottom surface and having conductive runs on the bottom surface and a plurality of holes extending through the board and intersecting the runs at selected locations, loosely positioning a plurality of electronic components on the top surface of said board with the leads of the components extending through selected holes and extending perpendicular to the bottom surface of the board, disposing a sheet of heat-sealable material covering said components and in contact with said top surface of the board in a plurality of areas including portions of the periphery of the board, applying a vacuum to the said bottom surface of the board and through said holes to draw said sheet around each of said components to firmly hold the components in place and heat-sealing said sheet to said board at selected locations on its periphery preparatory for soldering, soldering the leads of said components to said conducting runs to secure them in place independently of the sealed sheet, and removing said sheet from said board and leaving said components independently solder mounted on said board.

References Cited

UNITED STATES PATENTS

| | | | |
|---|---|---|---|
| 2,934,814 | 5/1960 | Williams et al. | 29—155.5 |
| 3,114,807 | 12/1963 | Koda | 200—87 |
| 3,139,610 | 6/1964 | Crown et al. | 29—155.5 |
| 3,277,566 | 10/1966 | Cristensen | 29—471.1 |

JOHN F. CAMPBELL, *Primary Examiner.*

R. W. CHURCH, *Assistant Examiner.*